(12) United States Patent
Park et al.

(10) Patent No.: US 8,179,491 B2
(45) Date of Patent: May 15, 2012

(54) THIN FILM TRANSISTOR HAVING IMPROVED FABRICATION AND PERFORMANCE CHARACTERISTICS AND DISPLAY DEVICE HAVING THE SAME

(75) Inventors: Kee-Bum Park, Cheonan-si (KR); Dong-Gyu Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 528 days.

(21) Appl. No.: 12/365,804

(22) Filed: Feb. 4, 2009

(65) Prior Publication Data
US 2009/0195724 A1      Aug. 6, 2009

(30) Foreign Application Priority Data

Feb. 4, 2008   (KR) .................. 10-2008-0011028

(51) Int. Cl.
*G02F 1/136* (2006.01)
*G02F 1/1345* (2006.01)
(52) U.S. Cl. ............. 349/46; 349/43; 349/139; 349/141
(58) Field of Classification Search .............. 349/42–46, 349/139–144
See application file for complete search history.

(56) References Cited

U.S. PATENT DOCUMENTS

| | | | | |
|---|---|---|---|---|
| 5,656,824 A * | 8/1997 | den Boer et al. | ................. | 257/59 |
| 5,668,650 A * | 9/1997 | Mori et al. | ................. | 349/42 |
| 6,864,928 B2 * | 3/2005 | Yoo et al. | ................. | 349/42 |
| 7,499,118 B2 * | 3/2009 | Park | ................. | 349/43 |
| 7,719,008 B2 * | 5/2010 | Lim et al. | ................. | 257/59 |
| 2005/0140909 A1 * | 6/2005 | Kim et al. | ................. | 349/151 |
| 2006/0033446 A1 * | 2/2006 | Kim et al. | ................. | 315/169.3 |

FOREIGN PATENT DOCUMENTS

| | | |
|---|---|---|
| FR | 2599559 A | 12/1987 |
| FR | 2599559 A1 * | 12/1987 |
| JP | 61108171 A | 5/1986 |
| JP | 9298305 | 11/1997 |
| KR | 10-0312758 | 10/2001 |
| KR | 10-0720099 | 5/2007 |
| KR | 1020070054809 A | 5/2007 |

OTHER PUBLICATIONS

European International Search Report dated Sep. 2, 2009.

* cited by examiner

*Primary Examiner* — Huyen Ngo

(74) *Attorney, Agent, or Firm* — Innovation Counsel LLP

(57) ABSTRACT

A thin-film transistor (TFT) is provided. The TFT includes a gate electrode; a dielectric layer and an active layer which are formed on the gate electrode; and source and drain electrodes which are formed on the active layer, each of the source and drain electrodes including a plurality of protruding portions and an empty space between each protruding portion, wherein the source and drain electrodes are spaced apart from each other and engage with each other, and further wherein the gate and source electrodes overlap each other and the gate and drain electrodes overlap each other.

8 Claims, 7 Drawing Sheets

THIN FILM TRANSISTOR HAVING IMPROVED FABRICATION AND PERFORMANCE CHARACTERISTICS AND DISPLAY DEVICE HAVING THE SAME

CROSS-REFERENCE TO RELATED APPLICATION

This application claims priority to Korean Patent Application No. 10-2008-0011028 filed on Feb. 4, 2008 in the Korean Intellectual Property Office, the disclosure of which is incorporated herein by reference in its entirety.

BACKGROUND OF THE INVENTION

1. Field of the Invention

The present invention relates generally to flat panel displays. More specifically, the invention relates to a thin-film transistor (TFT) of a gate driving module.

2. Description of the Related Art

The Liquid Crystal Display (LCD) is a flat panel display that includes an LCD panel. Typically, an LCD panel has a lower substrate on which pixel electrodes may be formed, an upper substrate on which a common electrode may be formed, a liquid crystal layer interposed between the lower substrate and the upper substrate, and a driving module which drives the LCD panel. An LCD displays an image by altering an electric field between the common electrode and the pixel electrodes in the LCD panel to vary the optical transmittance of the liquid crystal layer.

An increasing number of LCDs are integrating gate driving modules onto one or both of the substrates in order to reduce manufacturing cost. That is, thin-film transistors (TFTs) and pixel electrodes may be formed on a display region of the lower substrate, and a gate driving module may be formed on a peripheral region. The gate driving module includes two or more stages and is thus able to apply a gate-on voltage or a gate-off voltage to gate lines in response to a clock signal, an inverted clock signal, or a frame initiation signal, which is a type of control signal. As a result, the TFTs are sequentially turned on for each frame. Each stage of the gate driving module can include an amorphous silicon gate (ASG) circuit which includes ASG TFTs. An ASG circuit performs the same or similar functions as those of a gate driver integrated circuit (IC).

The TFTs of the gate driving module serve as switches that apply a gate-on voltage or a gate-off voltage to their respective gate lines in response to the clock signal, the inverted clock signal, or the frame initiation signal. The TFTs of the gate driving module can be formed when the TFTs in the display region are formed.

In general, TFTs are classified into I-type TFTs which have a source electrode that is formed as a straight line, or U-type TFTs which have a source electrode that is U-shaped. Typically, the TFTs in the display region are all U-type TFTs, whereas some of the TFTs of the gate driving module are U-type TFTs and the other TFTs of the gate driving module are I-type TFTs. Here, the I-type TFTs commonly maintain the ratios of the capacitance between a gate electrode and a drain electrode, and the capacitance between the gate electrode and a source electrode, at 1:1 and provide a channel length long enough to secure sufficient resistance.

However, the active layer of a U-type TFT can be more easily removed than the active layer of an I-type TFT due to the difference between the thicknesses of their respective photosensitive layers. The thickness of the active layers of the TFTs in the display region may differ from the thickness of the active layers of the TFTs in the gate driving module by as much as 1000-2000 Å (Angstroms). Due to this difference in thicknesses, the active layers of some of the TFTs of the gate driving module, where a long channel length is secured by using a half-tone mask, may be inadvertently removed during etching. Thus, the active layers of the TFTs of the gate driving module may not form stable channels, thereby causing the gate driving module to malfunction.

SUMMARY OF THE INVENTION

Aspects of the present invention provide a thin-film transistor (TFT) which is formed on a peripheral region of a liquid crystal display (LCD) panel as a U-type TFT and that has a gate-drain capacitance-to-gate-source capacitance ratio of about 1:1, and a TFT which is also formed on the peripheral region of the LCD panel as a U-type TFT and has a long channel length.

Aspects of the present invention also provide a display device including a TFT which is formed on a peripheral region of an LCD panel as a U-type TFT and has a gate-drain capacitance-to-gate-source capacitance ratio of about 1:1, and a TFT which is also formed on the peripheral region of the LCD panel as a U-type TFT and has a long channel length.

However, the present invention is not restricted by those aspects set forth herein. The above and other aspects of the present invention will become more apparent to one of ordinary skill in the art to which the present invention pertains by referencing the detailed description of the present invention given below.

According to an aspect of the present invention, a TFT comprises a gate electrode, a dielectric layer and an active layer formed on the gate electrode, and source and drain electrodes formed on the active layer, each of the source and drain electrodes comprising a plurality of protruding portions. The source and drain electrodes are spaced apart from each other and the protruding portions of the source and drain electrodes engage with each other while being separated by gaps. Additionally, the gate and source electrodes overlap each other and the gate and drain electrodes overlap each other.

According to another aspect of the present invention, a TFT comprises a gate electrode, a dielectric layer and an active layer formed on the gate electrode, and a plurality of floating electrodes formed on the active layer and indented in one direction. The TFT also includes source and drain electrodes which overlap the gate electrode and engage with outermost floating electrodes of the plurality of floating electrodes.

According to another aspect of the present invention, a display device comprises a display region which displays an image using a lower substrate on which a plurality of gate lines, a plurality of data lines, a plurality of pixel electrodes and a plurality of thin-film transistors (TFTs) are formed, and using an upper substrate on which a common electrode is formed. The display device also includes a gate driving module which comprises a plurality of TFTs that are formed on a portion of the lower substrate outside the display region, and a gate driving module configured to apply a control voltage to the gate lines. The gate driving module comprises a first TFT which includes a first gate electrode, a first source electrode having a plurality of protruding portions that are spaced apart from each other, and a first drain electrode having a plurality of protruding portions that engage with the protruding portions of the first source electrode.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EXEMPLARY EMBODIMENTS

Figure 1:
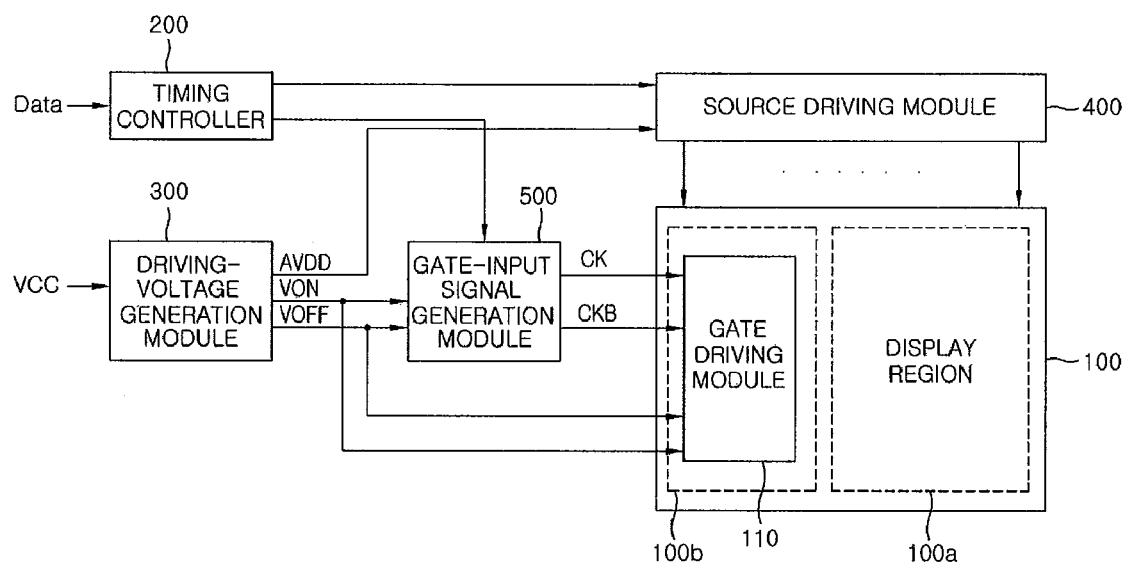
FIG. 1 is a block diagram of a liquid crystal display (LCD) according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein. Rather, these embodiments are provided so that this disclosure will be thorough and complete, and will fully convey the concept of the invention to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout. As used herein the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to limit the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Furthermore, relative terms such as "below," "beneath," or "lower," "above," and "upper" may be used herein to describe one element's relationship to another element as illustrated in the accompanying drawings. It will be understood that relative terms are intended to encompass different orientations of the device in addition to the orientation depicted in the accompanying drawings. For example, if the device in the accompanying drawings is turned over, elements described as being on the "lower" side of other elements would then be oriented on "upper" sides of the other elements. Similarly, if the device in one of the figures is turned over, elements described as "below" or "beneath" other elements would then be oriented "above" the other elements. Therefore, the exemplary terms "below" and "beneath" can, therefore, encompass both an orientation of above and below.

FIG. 1 is a block diagram of a liquid crystal display (LCD) according to an embodiment of the present invention. Referring to FIG. 1, the LCD includes an LCD panel 100, a timing controller 200, a driving-voltage generation module 300, a source driving module 400, and a gate-input-signal generation module 500. A gate driving module 110, including a plurality of amorphous silicon thin-film transistors (TFTs), is formed on the LCD panel 100.

The LCD panel 100 includes a lower substrate on which a plurality of pixel electrodes are formed; an upper substrate on which a common electrode is formed; and a liquid crystal layer which is interposed between the lower substrate and the upper substrate. A plurality of gate lines, which extend in a first direction, and a plurality of data lines, which are electrically isolated from the gate lines and intersect the gate lines by extending in a second direction different from the first direction, are formed on the lower substrate. A plurality of TFTs is respectively formed on one or more pixel regions. Each TFT includes a gate electrode connected to one of the gate lines, a source electrode connected to one of the data lines, and a drain electrode connected to one of the pixel electrodes. The gate lines, the data lines, the pixel electrodes, and the TFTs are all disposed in a display region 100a of the LCD panel 100. The gate driving module 110, which performs the same functions as a gate driver integrated circuit (IC), is formed on a peripheral region 100b of the LCD panel 100. The gate driving module 110 may include TFTs. The TFTs of the gate driving module 110 may be formed simultaneously with the TFTs in the display region 100a.

The timing controller 200 receives image data signals (DATA) and provides control signals to comply with the timing requirements of the source driving module 400 and the gate-input-signal generation module 500.

The driving-voltage generation module 300 generates a power supply voltage AVDD, a gate-on voltage VON, and a gate-off voltage VOFF, based on an input voltage VCC applied from an external source.

The source driving module 400 includes a plurality of source driver ICs. The source driving module 400 drives the data lines of the LCD panel 100 in response to a control signal provided by the timing controller 200 and the power supply voltage AVDD.

The gate-input-signal generation module 500 outputs a plurality of signals for controlling the gate driving module 110, e.g., a first clock signal CK and a second clock signal CKB, in response to a control signal provided by the timing controller 200 and the gate-on and gate-off voltages VON and VOFF. The second clock signal CKB may be an inverted signal of the first clock signal.

The gate driving module 110 drives the gate lines of the LCD panel 100 in response to the gate-on and gate-off voltages VON and VOFF, and the first and second clock signals CK and CKB.

Figure 2:
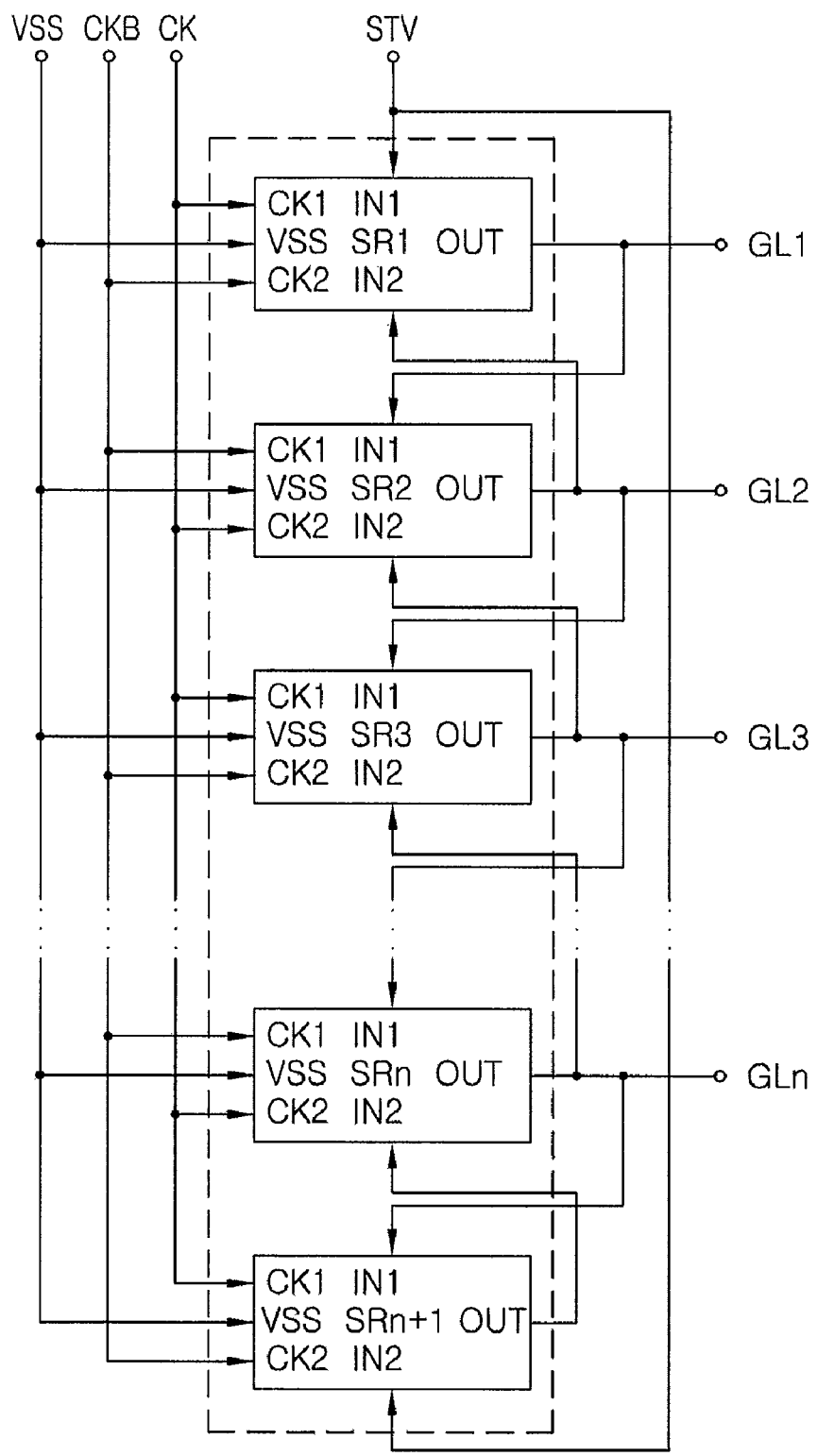
FIG. 2 is a circuit diagram of a gate driving module shown in FIG. 1.

FIG. 2 is a block diagram of the gate driving module 110. Referring to FIG. 2, the gate driving module 110 includes first through n-th stages (i.e., SR1 through SRn) and a dummy stage SRn+1, which are connected to one another in a cascade configuration. For example, if there are 100 gate lines, the gate driving module 110 may include 100 stages respectively corresponding to the 100 gate lines and a dummy stage.

Each of the stages SR1 through SRn, as well as the dummy stage SRn+1, includes a first input terminal IN1, an output terminal OUT, a second input terminal IN2, first and second clock signal input terminals CK1 and CK2, a ground voltage input terminal VSS, a gate-on voltage input terminal (not shown), and a gate-off voltage input terminal (not shown). The first and second clock signals CK and CKB are input signals to the first input terminals CK1 and the second input terminals CK2, respectively, of the odd-numbered stages SR1, SR3, ..., SRn−1 and the dummy stage SRn+1. The clock signals CK and CKB are also input to the second input terminals CK2 and the first input terminals CK1, respectively, of the even-numbered stages SR2, SR4, ..., SRn. A vertical synchronization initiation signal STV, which is output by the timing controller 200, is input to the first input terminal IN1 of the first stage SR1 and the second input terminal IN2 of the dummy stage SRn+1. The first input terminals IN1 of the second through n-th stages SR2 through SRn and the dummy stage SRn+1 are respectively connected to the output terminals OUT of the first through n-th stages SR1 through SRn. The second input terminals IN2 of the first through n-th stages are respectively connected to the output terminals OUT of the second through n-th stages and the dummy stage SRn+1. The output terminals of the first through n-th stages SR1 through SRn are respectively connected to first through n-th gate lines GL1 through GLn. A signal input to each of the second input terminals IN2 of the first through n-th stages SR1 through SRn is delayed by a duty period of an output signal of a corresponding stage. Therefore, the output signals of the first through n-th stages SR1 through SRn are sequentially activated, thereby sequentially driving the gate lines GL1 through GLn of the LCD panel 100.

Figure 3:
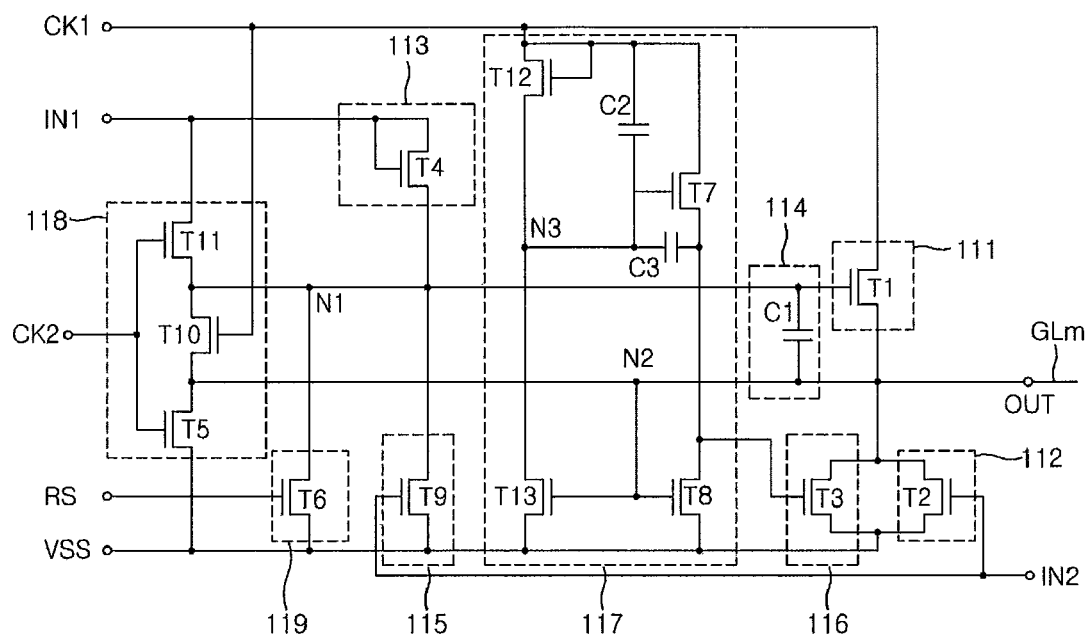
FIG. 3 is a detailed circuit diagram of a stage shown in FIG. 2.

FIG. 3 illustrates a detailed circuit diagram of one of the first through n-th stages SR1 through SRn of the gate driving module 110, and particularly, an m-th stage SRm having a first clock terminal CK1 to which the first clock signal CK is input, and a second clock terminal CK2 to which the second clock signal CKB is input. Referring to FIG. 3, the m-th stage SRm includes a pull-up unit 111 and a pull-down unit 112. The pull-up unit 111 pulls up the electrical potential of an output signal at an output terminal OUT to the electrical potential of the first clock signal CK, which is input into first clock terminal CK1. The pull-down unit 112 pulls down the output terminal OUT to the VSS voltage in response to the output signal of (m+1)-th stage SRm+1. The output signal of the (m+1)-th stage SRm+1 is input to the second input terminal IN2 of the m-th stage SRm. The pull-up unit 111 includes a first TFT T1 which has a gate electrode connected to a first node N1, a source electrode connected to the first clock terminal CK1, and a drain electrode connected to the output terminal OUT. The pull-down unit 112 includes a second TFT T2 which has a gate electrode connected to the second input terminal IN2, a source electrode connected to the output terminal OUT, and a drain electrode to which a ground voltage VSS is applied.

The m-th stage SRm also includes a pull-up driving unit which turns on the pull-up unit 111 in response to an output signal of an (m−1)-th stage SRm−1, and turns off the pull-up unit 111 in response to the output signal of the (m+1)-th stage SRm+1. The output signal of the (m−1)-th stage SRm−1 is input to the first input terminal IN1 of the m-th stage SRm. The pull-up driving unit includes a buffer 113, a charger 114, and a first discharger 115. The buffer 113 includes a fourth TFT T4 which has gate and source electrodes commonly connected to the first input terminal IN1, and a drain electrode connected to the first node N1. The charger 114 includes a first capacitor C1 which has a first electrode connected to the first node N1, and a second electrode connected to a second node N2. The first discharger 115 includes a ninth TFT T9 which has a gate electrode connected to the second input terminal IN2, a source electrode connected to the first node N1, and a drain electrode to which the ground voltage VSS is applied.

The m-th stage SRm also includes a holding unit 116 which holds the level of the output signal OUT at the ground voltage VSS, and a switching unit 117 which controls the operation of the holding unit 116. The holding unit 116 includes a third TFT T3 which has a gate electrode connected to a third node N3 through a third capacitor C3. A second electrode of the third capacitor C3 is connected to the gate electrode of the third TFT T3 and a first electrode of the third capacitor C3 is connected to a third node N3. The third TFT T3 also has a source electrode connected to the second node N2, and a drain electrode to which the ground voltage VSS is applied. The switching unit 117 includes seventh, eighth, twelfth and thirteenth TFTs T7, T8, T12, and T13 and second and third capacitors C2 and C3. The twelfth TFT T12 has gate and source electrodes connected to the first clock terminal CK1 and a drain electrode connected to the third node N3. The seventh TFT T7 has a source electrode connected to the first clock terminal CK1, a gate electrode connected to the first clock terminal CK1 through the second capacitor C2 (the gate electrode of T7 is also connected to the third node N3) and a drain electrode connected to the third node N3 through the third capacitor C3. The third capacitor C3 is connected between the gate electrode and the source electrode of the seventh TFT T7. The thirteenth TFT T13 has a gate electrode connected to the second node N2, a source electrode connected to the drain electrode of the twelfth TFT T12 (the source electrode of T13 is also connected to the third node N3) and a drain electrode to which the ground voltage VSS is applied. The eighth TFT T8 has a gate electrode connected to the second node N2, a source electrode connected to the drain electrode of the seventh TFT T7, and a drain electrode to which the ground voltage VSS is applied.

The m-th stage SRm also includes a ripple prevention unit 118 and a reset unit 119. The ripple prevention unit 118 includes fifth, tenth and eleventh TFTs T5, T10, and T11. The fifth TFT T5 has a gate electrode connected to the second clock terminal CK2, a source electrode connected to the second node N2, and a drain electrode to which the ground voltage VSS is applied. The tenth TFT T10 has a gate electrode connected to the first clock terminal CK1, a source electrode connected to the drain electrode of the eleventh TFT T11 (the source electrode of T10 is also connected to the first node N1), and a drain electrode connected to the second node N2. The eleventh TFT T11 has a gate electrode connected to the second clock terminal CK2, a source electrode connected to the first input terminal IN1, and a drain electrode connected to the first node N1. The reset unit 119 includes a sixth TFT T6 which has a gate electrode connected to a reset terminal RS, a source electrode connected to the first node N1, and a drain electrode to which the ground voltage VSS is applied. An output signal of the last stage (i.e., the n-th stage SRn in FIG. 2) is applied to the reset terminal RS.

The sixth through ninth TFTs (i.e., T6 through T9) each have a gate-source capacitance (Cgs)-to-gate-drain capacitance (Cgd) ratio of about 1:1, and the twelfth TFT (T12) has a longer channel length (e.g., about 14 μm or more) than the other transistors. That is, the gate electrode of the first TFT T1 of the pull-up unit 111 is controlled by the sixth and ninth transistors T6 and T9. If the sixth and ninth transistors T6 and T9 have different parasitic capacitances, the electric potential of the first node N1 may vary, and thus, the first TFT T1 of the pull-up unit 111 may malfunction. The gate electrode of the third TFT T3 of the holding unit 116 is controlled by the seventh and eighth transistors T7 and T8. If the seventh and eighth transistors T7 and T8 have different parasitic capacitances, the electric potential of the third node N3 may vary, and thus, the third TFT T3 of the holding unit 116 may malfunction. Therefore, the sixth through ninth TFTs T6 through T9 each preferably maintain a gate-source capacitance (Cgs)-to-gate-drain capacitance (Cgd) ratio of about 1:1. The twelfth TFT T12 preferably has a channel length of about 14 μm or more in order to secure sufficient resistance to prevent a current from flowing from the third node N3 to the first clock terminal CK1 even when a low-level signal is applied through the first clock terminal CK1 and the third node N3 is maintained to have a high electric potential. Conventionally, the sixth through ninth TFTs T6 through T9 and the twelfth TFT T12 are designed as I-type TFTs, and the first through fifth, tenth and thirteenth TFTs T1 through T5, T1 and T13 are designed as U-type TFTs. On the other hand, in this embodiment of the present invention, the first through thirteenth TFTs T1 through T13 are all designed as U-type TFTs, and this will hereinafter be described in further detail.

Figure 4:
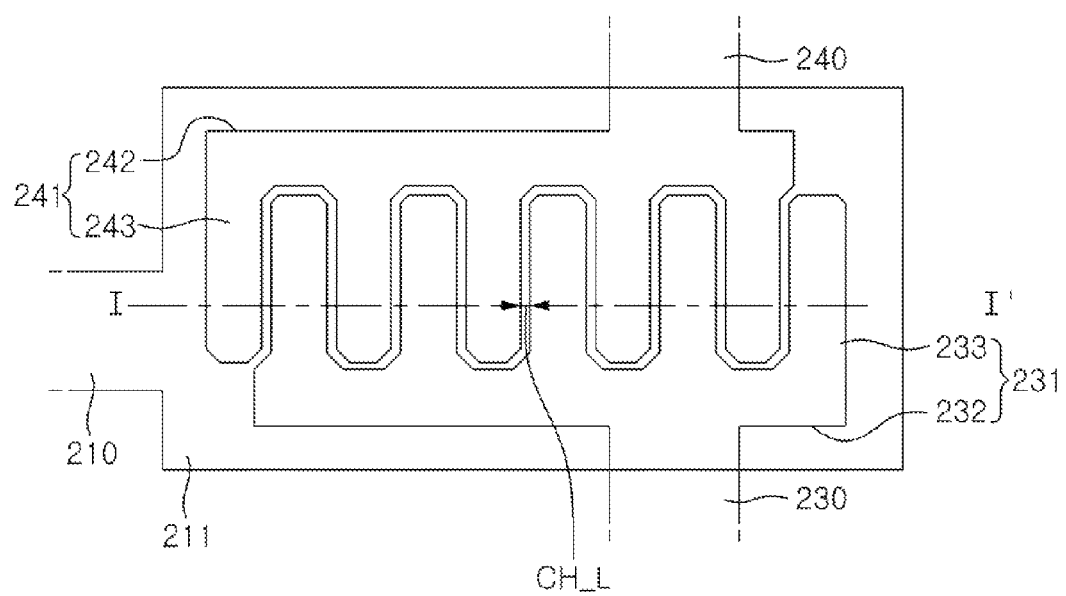
FIG. 4 illustrates a plan view of an embodiment of a TFT of the gate driving module shown in FIG. 1.
Figure 5:
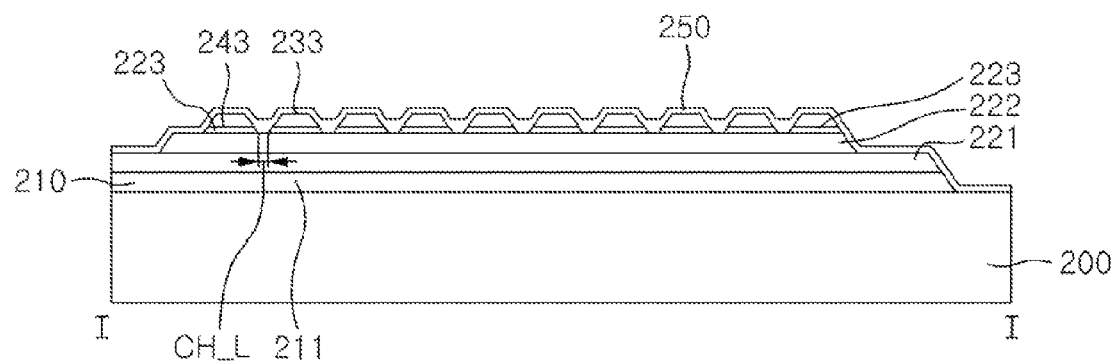
FIG. 5 illustrates a cross-sectional view taken along line I-I' of FIG. 4.
Figure 6:
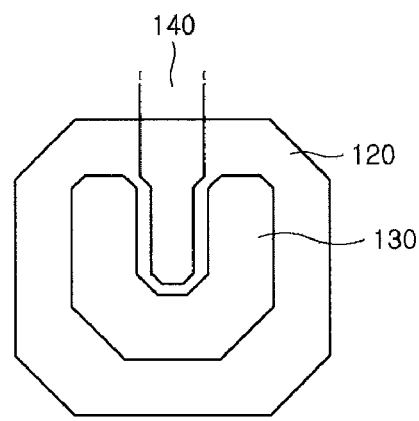
FIG. 6 illustrates a plan view of an embodiment of a TFT in a display region shown in FIG. 1.

FIG. 4 illustrates a plan view of a TFT capable of maintaining a gate-source capacitance (Cgs)-to-gate-drain capacitance (Cgd) of about 1:1, and FIG. 5 illustrates a cross-sectional view taken along line I-I' of FIG. 4. The sixth, seventh, eighth and ninth TFTs T6 through T9 in FIG. 3 may have the same structure as that of the TFT shown in FIGS. 4 and 5. FIG. 6 illustrates a plan view of a TFT in the display region 100a as shown in FIG. 1.

Referring to FIGS. 4 and 5, the transistor includes a first electrode line 210 which is formed in a first direction; a first electrode 211 which extends from the first electrode line 210; a second electrode line 230 which is formed in a second direction different from the first direction and is electrically isolated from the first electrode line 210; a second electrode 231 which is branched off from the second electrode line 230 and is disposed over (but electrically isolated from) the first electrode 211; a third electrode line 240 which is electrically isolated from the first electrode line 210 and is spaced apart from the second electrode line 230; and a third electrode 241 which is branched off from the third electrode line 240, is disposed over (but electrically isolated from) the first electrode 211 and is spaced apart from the second electrode 231.

The first electrode line 210 is formed on a substrate 200, as shown in FIG. 5 and extends in, for example, a row direction. The first electrode 211 extends from the first electrode line 210 and has a greater width than the first electrode line 210. The first electrode line 210 and the first electrode 211 may be formed when a gate electrode 120 (shown in FIG. 6) is formed on the display region 100a of the LCD panel 100, as shown in FIG. 1.

With reference to FIG. 5, a first electrode line 210, first electrode 211, and dielectric layer 221 are formed on the substrate 200. The dielectric layer 221 may be an inorganic dielectric layer, which is formed of silicon oxide ($SiO_2$) or silicon nitride (SiNx) and has a single-layer or multilayer structure. The dielectric layer 221 may be formed when a gate insulation layer (not shown) is formed on the display region 100a of the LCD panel 100 as shown in FIG. 1.

Again with reference to FIG. 5, an active layer 222 is formed of a first semiconductor material on the dielectric layer 221. An ohmic contact layer 223 is formed of a second semiconductor material on the active layer 222. The active layer 222 may overlap at least part of the first electrode 221. That is, the active layer 222 may have the same size as, or a smaller size than, that of the first electrode 211. The first semiconductor material may include amorphous silicon, and the second semiconductor material may include silicide or n+ hydrogenated amorphous silicon doped with a high concentration of n-type impurities. The active layer 222 and the ohmic contact layer 223 may be formed when an active layer and an ohmic contact layer are formed on the display region 100a of the LCD panel 100, as shown in FIG. 1.

With reference to FIG. 4, the second electrode line 230 extends upwardly in, for example, a column direction, and intersects the first electrode line 210. The second electrode 231 is branched off from the second electrode line 230 and has a greater width than the second electrode line 230. The second electrode 231 overlaps part of the first electrode 211. The second electrode 231 includes a generally bar-shaped portion 232, which has a predetermined width and length. A plurality of protruding portions 233, which extend upwardly from the generally bar-shaped portion 232, are spaced apart from one another. That is, the second electrode 231 includes a plurality of generally finger-shaped patterns.

Again with reference to FIG. 4, the third electrode line 240 extends downward in, for example, the column direction, and intersects the first electrode line 210. The third electrode 241 is branched off from the third electrode line 240 and has a greater width than the third electrode line 240. The third electrode 241 overlaps part of the first electrode 211. The third electrode 241 includes a generally bar-shaped portion 242, which has a predetermined width and length. A plurality of protruding portions 243, which extend downwardly from the generally bar-shaped portion 242, are spaced apart from one another. That is, the third electrode 241 includes a plurality of generally finger-shaped patterns.

Again with reference to FIG. 4, the bar-shaped portion 232 of the second electrode 231 and the bar-shaped portion 242 of the third electrode 241 are spaced apart from each other. The protruding portions 243 of the third electrode 241 are disposed among the protruding portions 233 of the second electrode 231, and vice versa. That is, the second electrode 231 and the third electrode 241 are spaced apart from each other so that the respective finger-shaped patterns engage with each other while maintaining gaps therebetween. The second electrode line 230 and the third electrode line 240 may be formed by the same operation. More specifically, the second electrode line 230 and the third electrode line 240 may be formed when source and drain electrodes 130 and 140 of FIG. 6 are formed on the display region 100a of the LCD panel 100, as shown in FIG. 1. Therefore, the width of the second electrode line 230 and the third electrode line 240 may be the same as the width of the source and drain electrodes 130 and 140, and the gap between the second electrode 231 and the third electrode 241 may have the same width as the gap between the source and drain electrodes 130 and 140, of FIG. 6.

Again with reference to FIG. 4, the first electrode 211 may be a gate electrode. The second electrode 231 may be a drain electrode, and the third electrode 241 may be a source electrode. Alternatively, the second electrode 231 may be a source electrode, and the third electrode 241 may be a drain electrode. Therefore, if the TFT of the embodiment of FIGS. 4 and 5 is the seventh TFT T7 shown in FIG. 3, the first electrode 211 may be connected to third node N3, and the second and third electrodes 231 and 241 may be connected to either the first clock terminal CK1 or the gate electrode of the third TFT T3. The width of the protruding portions 233 of the second electrode 231 and the protruding portions 243 of the third electrode 241 may be about 4.5-5.0 μm, and the gap between the second electrode 231 and the third electrode 241 may have a width of about 2.0-2.5 μm, as measured by after-cleaning inspection (ACI). Since the gap between the second electrode 231 and the third electrode 241 corresponds to channel length CH L, the gap between a pair of adjacent protruding portions 233 of the second electrode 231, or between a pair of adjacent protruding portions 243 of the third electrode 231, may have a width of about 8.5-10 μm, as measured by ACI.

With reference to FIG. 5, a passivation layer 250 can be formed on the entire surface of the substrate 200 on which the second and third electrode lines 230 and 240 are formed as shown in FIG. 4. As can be seen in FIG. 5, the passivation layer 250 can be formed on the protruding portions 233 and 243, the ohmic contact layer 223, the active layer 222 and the first electrode line 210. Similarly, the passivation layer 250 can be formed over, in order, the ohmic contact layer 223, the active layer 222, the dielectric layer 221, the first electrode 211, the first electrode line 210 and then the substrate 200. The passivation layer 250 may have a single layer structure or a multilayer structure including an organic dielectric layer or an inorganic dielectric layer, which is formed of silicon oxide ($SiO_2$) or silicon nitride ($SiNx$).

As described above, and with reference to FIG. 4, the second electrode 231 and the third electrode 241 may have the same area, and particularly, the same shape, and may engage with each other. Thus, the amount of overlapping area between the first electrode 211 and the second electrode 231 may be the same as that between the first electrode 211 and the third electrode 241. Therefore, it is possible to uniformly maintain the ratio of gate-source capacitance Cgs and gate-drain capacitance Cgd of the TFT shown in FIGS. 4 and 5 at about 1:1.

The second electrode 230 and the third electrode 240 are shown in FIG. 4 as having five finger-shaped patterns, but the present invention is not restricted to this. That is, each second electrode 230 and third electrode 240 may each include any number of protruding portions.

The TFT of the embodiment of FIGS. 4 and 5 has an inverted staggered-type structure, in which the first electrode line 210 is formed on the substrate 200 and then the second and third electrode lines 230 and 240 are formed on the first electrode line 210. However, the present invention can also be applied to a staggered-type structure in which the second and third electrode lines 230 and 240 are formed on the substrate 200 and then the first electrode line 210 is formed on the second and third electrode lines 230 and 240.

FIG. 6 shows a U-type (i.e., generally U-shaped) TFT having gate electrode 120, source electrode 130 and drain electrode 140. As seen in FIG. 6, the overlap area between gate electrode 120 and source electrode 130 is much greater than the overlap area between gate electrode 120 and drain electrode 140, thus there is a difference between their respective parasitic capacitances.

Figure 7:
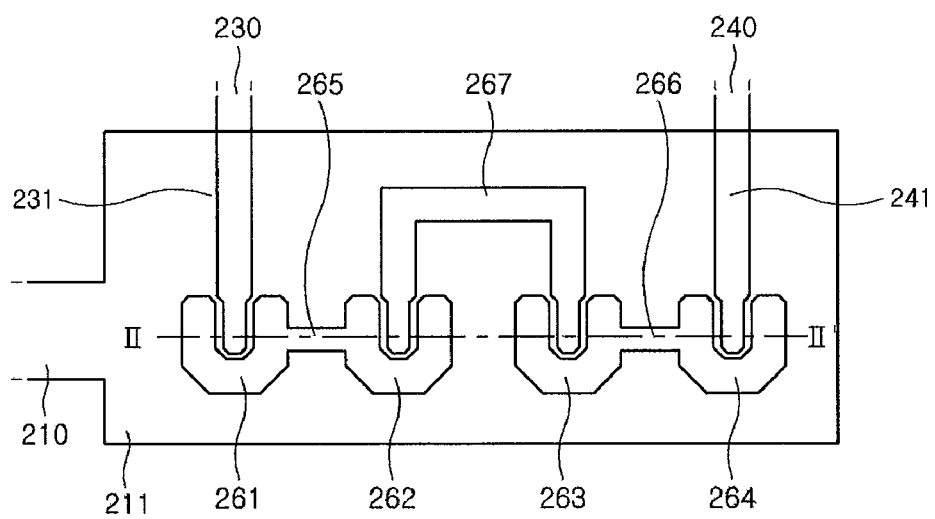
FIG. 7 illustrates a plan view of another embodiment of a TFT of the gate driving module shown in FIG. 1.
Figure 8:
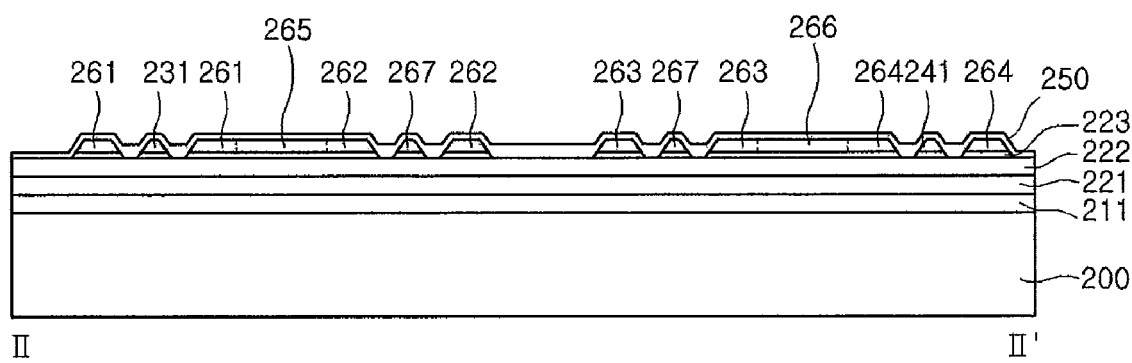
FIG. 8 illustrates a cross-sectional view taken along line II-II' of FIG. 7.

FIG. 7 illustrates a plan view of a TFT having a channel length long enough to produce sufficient resistance, and FIG. 8 illustrates a cross-sectional view taken along line II-II' of FIG. 7. The twelfth TFT T12 may have the same structure as the TFT of the embodiment shown in FIGS. 7 and 8.

Referring to FIGS. 7 and 8, the TFT includes a first electrode line 210 which is formed in a first direction; a first electrode 211 which extends from the first electrode line 210; a second electrode line 230 which is electrically isolated from the first electrode line 210; a second electrode 231 which is branched off from the second electrode line 230 and is disposed on the first electrode 211; a third electrode line 240 which is electrically isolated from the first electrode line 210 and is spaced apart from the second electrode line 230; and a third electrode 241 which is branched off from the third electrode line 240, is disposed on the first electrode 211 and is spaced apart from the second electrode 231.

The second electrode 231 accounts for the overlapping area of the second electrode line 230 and the first electrode 211, and the third electrode 241 accounts for the overlapping area of the third electrode line 240 and the first electrode 211. The TFT also includes first, second, third and fourth floating electrodes 261, 262, 263 and 264, respectively, which are formed on the first electrode 211, and which are electrically isolated from the first electrode 211 and generally U-shaped. The TFT also includes a first connecting electrode 265 which connects the first and second floating electrodes 261 and 262; a second connecting electrode 266 which connects the third and fourth floating electrodes 263 and 264; and a bridge electrode 267 which engages with the second and third floating electrodes 262 and 263.

With reference to FIG. 7, the first electrode line 210 is formed on a substrate 200 shown in FIG. 8 and extends in, for example, the row direction. The first electrode 211 extends from the first electrode line 210 and may have a larger width than the first electrode line 210. The first electrode line 210 and the first electrode 211 may be formed when the gate electrode 120 shown in FIG. 6 is formed on the display region 100a of the LCD panel 100, as shown in FIG. 1.

With reference to FIG. 8, a dielectric layer 221 is formed on the substrate 200 on which the first electrode line 210 and the first electrode 211 are formed. An active layer 222 is formed of a first semiconductor material on the dielectric layer 221. An ohmic contact layer 223 is formed of a second semiconductor material on the active layer 222.

With reference to FIG. 7, the second electrode line 230 extends downwardly in, for example, the column direction, and intersects the first electrode line 210. The second electrode 231 extends from the second electrode line 230. The second electrode 231 overlaps part of the first electrode 211, and particularly, part of the active layer 222 shown in FIG. 8. The second electrode 231 engages with the first floating electrode 261 and is a predetermined distance apart from the first floating electrode 261. The width of a portion of the second electrode 231 that engages with the first floating electrode 261 may be less than the width of the second electrode line 230.

Again with reference to FIG. 7, the third electrode line 240 extends downwardly in, for example, the column direction, and intersects the first electrode line 210. That is, the third electrode line 240 extends in parallel with the second electrode line 230. The third electrode 241 is branched off from the third electrode line 240, and overlaps part of the first electrode 211. The third electrode 231 engages with the fourth floating electrode 264 and is a predetermined distance apart from the fourth floating electrode 264. The width of a portion of the third electrode 241 that engages with the fourth floating electrode 264 may be less than the width of the third electrode line 240.

Again with reference to FIG. 7, the first through fourth floating electrodes 261 through 264 may be U-shaped. That is, each of the four floating electrodes 261, 262, 263 and 264 may include a bar-shaped portion which may extend in parallel with the first electrode line 210, and two protruding portions which extend from both ends of the bar-shaped portion. The first through fourth floating electrodes 261, 262, 263 and 264 may be evenly spaced apart from one another. The first connecting electrode 265 is formed between the first and second floating electrodes 261 and 262, and connects the first and second floating electrodes 261 and 262. The second connecting electrode 266 is formed between the third and fourth floating electrodes 263 and 264, and connects the third and fourth floating electrodes 263 and 264. The bridge electrode 267 includes a bar-shaped portion which extends in parallel with the first electrode line 210, and two protruding portions which extend downwardly from both ends of the bar-shaped portion. The two protruding portions of the bridge electrode 267 extend downwardly from the bar-shaped portion of the bridge electrode 267 and respectively engage with the second and third floating electrodes 262 and 263. The width of the end-portions of the two protruding portions of the bridge electrode 267 may be less than the width of the other portions of the two protruding portions of the bridge electrode 267. For instance, in FIG. 7, the end-portions of the two protruding portions that engage with the second and third floating electrodes 262 and 263 are shown as narrow, tapered end-portions.

Again with reference to FIG. 7, the second electrode line 230, the third electrode line 240, the first through fourth floating electrodes 261, 262, 263 and 264, the bridge electrode 267, and the first and second connecting electrodes 265 and 266 may be formed by the same operation when the source electrode 130 and the drain electrode 140 of FIG. 6 are formed on the display region 100a of the LCD panel 100 as shown in FIG. 1. The width of the second electrode line 230, the third electrode line 240, the first through fourth floating electrodes 261, 262, 263 and 264, the bridge electrode 267, and the first and second connecting electrodes 265 and 266 may be the same as the width of the source and drain electrodes 130 and 140 of FIG. 6. The gaps between the second electrode line 230 and the first floating electrode 261, between the bridge electrode 267 and the second and third floating electrodes 262 and 263, and between the third electrode line 240 and the fourth floating electrode 264, may have the same width as the gap between the source and drain electrodes 130 and 140 of FIG. 6.

Again with reference to FIG. 7, the first electrode 211 may be a gate electrode. The second electrode 231 may be a drain electrode, and the third electrode 241 may be a source electrode. Alternatively, the second electrode 231 may be a source electrode, and the third electrode 241 may be a drain electrode. Therefore, if the TFT of the embodiment of FIGS. 7 and 8 is the twelfth TFT T12, the first and second electrodes 211 and 231 may be connected to the first clock terminal CK1 through the first and second electrode lines 210 and 230, respectively, and the third electrode 241 may be connected to the third node N3, as shown in FIG. 3. The first through fourth floating electrodes 261, 262, 253 and 264 may have a width of about 6.0-6.5 µm, and the second electrode 231, the third electrode 241, and the bridge electrode 267 may also have a width of about 6.0-6.5 µm. The portions of the second electrode 231, the third electrode 241 and the bridge electrode 267 that engage with the first through fourth floating electrodes 261, 262, 263 and 264 may have a width of about 4.5-5.0 µm. The gaps between the second electrode 231 and the first floating electrode 261, between the bridge electrode 267 and the second and third floating electrodes 262 and 263, and between the third electrode 241 and the fourth floating electrode 264, account for channel length. Each channel length may be about 3.5-4.5 µm. The TFT of the embodiment of FIGS. 7 and 8 may have a total channel length of about 14-18 µm. Therefore, the gap between the two protruding portions of each of the first through fourth floating electrodes 261 through 264 may have a width of about 11.5-14.5 µm.

With reference to FIG. 8, a passivation layer 250 is formed on the entire surface of the substrate 200 on which the second and third electrode lines 230 and 240 are formed, as shown in FIG. 4. As seen in FIG. 8, the passivation layer 250 is also formed on the second and third electrodes 231 and 241, the first through fourth floating electrodes 261, 262, 263 and 264, the first and second connecting electrodes 265 and 266, and bridge electrode 267. The passivation layer 250 is formed over, in order, the ohmic contact layer 223, the active layer 222, the dielectric layer 221, the first electrode 211, the first electrode line 210, and then the substrate 200. The passivation layer 250 may have a single layer structure or a multilayer structure including an organic dielectric layer or an inorganic dielectric layer, which is formed of silicon oxide ($SiO_2$) or silicon nitride (SiNx).

The first through fourth floating electrodes 261, 262, 263 and 264 are shown in FIG. 7 as being indented in the same direction, but the present invention is not restricted to this. That is, the first through fourth floating electrodes 261, 262, 263 and 264 may be indented in different directions. However, the second and third floating electrodes 262 and 264, which engage with the bridge electrode 267, should be indented in the same direction.

In the embodiment of FIGS. 7 and 8, the first through fourth floating electrodes 261, 262, 263 and 264 are formed on the first electrode 211, the second and third electrodes 231 and 241 engage with the first and fourth floating electrodes 261 and 264, respectively, and the second and third floating electrodes 262 and 263 engage with the two protruding portions, respectively, of the bridge electrode 267. Therefore, the channels between the second electrode 231 and the first floating electrode 261, between the bridge electrode 267 and the second and third floating electrodes 262 and 263, and between the third electrode 241 and the fourth floating electrode 264, may serve as resistors that are connected in series, and may provide a total channel length of about 14-18 µm, thereby securing sufficient resistance.

According to the present invention, a gate driving module may include a U-type TFT which is capable of maintaining a ratio of gate-drain capacitance Cgd and gate-source capacitance Cgs at about 1:1 and wherein the TFT also includes a source electrode having a plurality of finger-shaped patterns and a drain electrode also having a plurality of finger-shaped patterns and engaging with the source electrode.

The gate driving module also includes a TFT which has a channel length long enough to secure sufficient resistance and includes a plurality of U-shaped floating electrodes and source and drain electrodes that engage with some of the U-shaped floating electrodes.

Therefore, it is possible to achieve more uniform patterning for the manufacture of TFTs by forming U-type TFTs not only in a display region on a lower substrate of an LCD panel, but also in a peripheral region on the lower substrate. In addition, it is possible to prevent the active layers of TFTs in the peripheral region from being removed excessively even when the TFTs in the peripheral region are formed by the same operation used to form TFTs in the display region. Thus, it is possible to better prevent the malfunction of the TFTs in the peripheral region.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin-film transistor (TFT) comprising:
   a gate electrode;
   a dielectric layer and an active layer formed on the gate electrode; and
   source and drain electrodes formed on the active layer, each of the source and drain electrodes comprising a plurality of protruding portions;
   wherein the source and drain electrodes are spaced apart from each other and the protruding portions of the source and drain electrodes engage with each other while being separated by gaps, and further wherein the gate and source electrodes overlap each other and the gate and drain electrodes overlap each other, thereby being capable of maintaining a ratio of gate-to-drain capacitance to gate-to-source capacitance at approximately 1:1.

2. The TFT of claim 1, wherein an area of overlap between the gate electrode and the source electrode is approximately the same as an area of overlap between the gate electrode and the drain electrode.

3. The TFT of claim 2, wherein the source and drain electrodes have approximately the same area and the same size.

4. The TFT of claim 1, wherein the protruding portions of the source electrode further comprise:
   a first bar-shaped portion which is formed in a first direction; and
   a plurality of first protruding portions which extend from the first bar-shaped portion toward the drain electrode and which are spaced apart from each other.

5. The TFT of claim 4, wherein the protruding portions of the drain electrode further comprise:
   a second bar-shaped portion which is formed in the first direction; and
   a plurality of second protruding portions which extend from the second bar-shaped portion toward the source electrode and which are spaced apart from each other.

6. A display device comprising:
   a display region which displays an image using a lower substrate on which a plurality of gate lines, a plurality of data lines, a plurality of pixel electrodes and a plurality of thin-film transistors (TFTs) are formed, and using an upper substrate on which a common electrode is formed; and
   a gate driving module which comprises a plurality of TFTs that are formed on a portion of the lower substrate outside the display region, the gate driving module configured to apply a control voltage to the gate lines;
   wherein the gate driving module comprises a TFT which includes a gate electrode, a source electrode having a plurality of protruding portions that are spaced apart from each other, and a drain electrode having a plurality of protruding portions that engage with the protruding portions of the source electrode, so as to be capable of maintaining a ratio of gate-to-drain capacitance to gate-to-source capacitance at approximately 1:1.

7. The display device of claim 6, wherein the TFTs in the display region and the TFTs of the gate driving module are substantially the same types of TFTs.

8. The display device of claim 7, wherein a capacitance between the gate electrode and the source electrode is about the same as a capacitance between the gate electrode and the drain electrode.

* * * * *